United States Patent
Clayton et al.

(10) Patent No.: US 9,212,782 B2
(45) Date of Patent: Dec. 15, 2015

(54) CRYOSTAT RADIATION SHIELD WITH JOINING CONDUIT SUPPLIED WITH VENTED CRYOGEN GAS

(75) Inventors: Nicholas John Clayton, Oxford (GB); Richard Gowland, Oxon (GB); Edgar Charles Malcolm Rayner, Oxon (GB)

(73) Assignee: Siemens PLC, Camberley (GB)

( * ) Notice: Subject to any disclaimer, the term of this patent is extended or adjusted under 35 U.S.C. 154(b) by 2100 days.

(21) Appl. No.: 12/252,493

(22) Filed: Oct. 16, 2008

(65) Prior Publication Data

US 2009/0107151 A1    Apr. 30, 2009

(30) Foreign Application Priority Data

Oct. 16, 2007  (GB) .................................. 0720191.6

(51) Int. Cl.
| | |
|---|---|
| F17C 7/04 | (2006.01) |
| F17C 3/10 | (2006.01) |
| F17C 13/00 | (2006.01) |
| F25D 23/06 | (2006.01) |
| F17C 3/08 | (2006.01) |
| G01R 33/38 | (2006.01) |

(52) U.S. Cl.
CPC ......... *F17C 3/085* (2013.01); *F17C 2203/0687* (2013.01); *F17C 2221/017* (2013.01); *F17C 2270/0536* (2013.01); *G01R 33/3804* (2013.01); *Y10T 29/4935* (2015.01)

(58) Field of Classification Search
CPC .................. F17C 2203/0687; F17C 2221/017; F17C 2270/0536; F17C 3/085; G01R 33/3804; Y10T 29/4935
USPC ................................. 62/48.1, 48.3, 50.7, 273
See application file for complete search history.

(56) References Cited

U.S. PATENT DOCUMENTS

| | | | | |
|---|---|---|---|---|
| 2,707,377 | A | * | 5/1955 | Morrison ........................ 62/48.3 |
| 3,304,728 | A | * | 2/1967 | De Haan ........................ 62/48.3 |
| 4,140,073 | A | * | 2/1979 | Androulakis ................ 114/74 A |
| 4,622,824 | A | * | 11/1986 | Creedon ........................ 62/50.7 |
| 5,226,299 | A | | 7/1993 | Moiseev |
| 5,277,457 | A | * | 1/1994 | Hayashi ........................ 285/331 |
| 5,470,112 | A | * | 11/1995 | Keating .......................... 285/24 |
| 5,832,164 | A | * | 11/1998 | Miekis .......................... 385/136 |
| 5,930,962 | A | * | 8/1999 | Sokolean ..................... 52/220.1 |
| 6,082,353 | A | * | 7/2000 | van Doorn .................... 126/659 |
| 6,296,282 | B1 | * | 10/2001 | Burkhardt et al. .............. 285/49 |
| 6,330,980 | B1 | * | 12/2001 | Fiedrich .......................... 237/69 |
| 6,843,516 | B2 | * | 1/2005 | Bishop et al. ................. 285/420 |
| 6,848,464 | B2 | * | 2/2005 | Ransom ........................ 137/312 |
| 6,983,766 | B2 | * | 1/2006 | Baron et al. .................... 138/98 |
| 2002/0108662 | A1 | * | 8/2002 | Opperthauser ............... 138/149 |
| 2003/0075226 | A1 | * | 4/2003 | Codling et al. ............... 138/113 |
| 2005/0183425 | A1 | * | 8/2005 | Immel ............................ 62/47.1 |

FOREIGN PATENT DOCUMENTS

| | | |
|---|---|---|
| DE | 102005035647 | 2/2007 |
| FR | 1 569 965 | 4/1969 |

\* cited by examiner

*Primary Examiner* — M. Alexandra Elve
*Assistant Examiner* — Henry Crenshaw
(74) *Attorney, Agent, or Firm* — Schiff Hardin LLP

(57) ABSTRACT

A cryostat has a cryogen vessel retained within an outer vacuum container, the cryogen vessel being provided with a vent path allowing cryogen gas to escape from the cryogen vessel, the cryostat further having a thermal radiation shield interposed between the cryogen vessel and the outer vacuum container. The vent path is arranged such that escaping cryogen gas is directed through a conduit, which forms an integral part of a thermal radiation shield.

23 Claims, 4 Drawing Sheets

CRYOSTAT RADIATION SHIELD WITH JOINING CONDUIT SUPPLIED WITH VENTED CRYOGEN GAS

BACKGROUND OF THE INVENTION

1. Field of the Invention

The present invention relates to cryostats including cryogen vessels for retaining cooled equipment such as superconductive magnet coils. In particular, the present invention relates to radiation shields provided for reducing thermal radiation reaching a cryogen vessel from cryostat components which are at a higher temperature, and to venting arrangements allowing cryogen gas to escape from the cryogen vessel.

2. Description of the Prior Art

FIG. 1 shows a conventional arrangement of a cryostat including a cryogen vessel 12. A cooled superconducting magnet 10 is provided within cryogen vessel 12, itself retained within an outer vacuum chamber (OVC) 14. One or more thermal radiation shields 16 are provided in the vacuum space between the cryogen vessel 12 and the outer vacuum chamber 14. In some known arrangements, a refrigerator 17 is mounted in a refrigerator sock 15 located in a turret 18 provided for the purpose, towards the side of the cryostat. Alternatively, a refrigerator 17 may be located within access turret 19, which retains access neck (vent tube) 20 mounted at the top of the cryostat. The refrigerator 17 provides active refrigeration to cool cryogen gas within the cryogen vessel 12, in some arrangements by re-condensing it into a liquid. The refrigerator 17 may also serve to cool the radiation shield 16. As illustrated in FIG. 1, the refrigerator 17 may be a two-stage refrigerator. A first cooling stage is thermally linked to the radiation shield 16, and provides cooling to a first temperature. In a cryostat with a single shield, the first stage typically cools the shield to about 50K. In cryostats with two shields, they are typically cooled to temperatures of about 80K and 20K. A second cooling stage provides cooling of the cryogen gas to a much lower temperature, typically in the region of 4-10K.

A negative electrical connection 21a is usually provided to the magnet 10 through the body of the cryostat. A positive electrical connection 21 is usually provided by a conductor passing through the vent tube 20.

For fixed current lead (FCL) designs, a separate vent path (auxiliary vent) (not shown in FIG. 1) is provided as a fail-safe vent in case of blockage of the vent tube.

The present invention addresses the consumption of cryogen during transportation of the cryostat, or at any time that the refrigerator 17 is inoperative. When the refrigerator 17 is inoperative, heat from the OVC 14, which is at approximately ambient temperature (250-315K), will flow towards the cryogen vessel 12 by any available mechanism. This may be by conduction through support structures (not illustrated) which retain the cryogen vessel and the radiation shield 16 in position within the OVC; by convection using of gases, typically hydrogen, which may be present in the volume between the cryogen vessel 12 and the OVC 14; or by radiation from the inner surface of the OVC. Much attention is typically paid to reducing all of these possible mechanisms for thermal influx. Support structures are made as long and thin as mechanically practicable, and are constructed from materials of low thermal conductivity, to reduce thermal influx by conduction. Care is taken to remove as much gas as possible from the volume between the cryogen vessel and the OVC, although many gases will freeze as a frost on the surface of a cryogen vessel if a very cold cryogen such as helium is in use. There are some measurements of hydrogen gas being released from the steel which makes up the cryostat. Any such released hydrogen will degrade the OVC vacuum. However, in the case of a helium cryogen, the hydrogen is solid during normal operation and will only be released as a gas if the cryogen vessel heats up to above about 20K.

One or more thermal radiation shields 16 are provided to intercept thermal radiation from the OVC. Any resultant heating of the thermal radiation shield is removed by the refrigerator 17. Further thermal insulation may be provided, such as the well-known "super-insulation": multilayered insulation of aluminized polyester sheet, typically aluminized polyethylene terephthalate sheet, placed in a layer between the cryogen vessel and the thermal shield 16; or between the thermal shield 16 and the OVC; or both.

In operation, cryogen liquid in cryogen vessel 12 boils, keeping the cooled equipment 10 at a constant temperature, being the boiling point of the cryogen. Refrigerator 17 removes heat from the cryogen gas and the thermal shield 16. Provided that the cooling power of the refrigerator is sufficient to remove any heat generated by the cooled equipment and any heat influx reaching the cryogen vessel, the cooled equipment 10 will remain at its steady temperature, and cryogen will not be consumed.

A difficulty arises during transportation of the cryostat, when the refrigerator is switched off; or at any other time that the refrigerator 17 is inoperative. With the refrigerator inoperative, any heat influx reaching the cryogen vessel, and any heat generated within the cryogen vessel, will cause cryogen liquid to boil. As the refrigerator is inoperative, the boiled-off cryogen cannot be re-condensed into liquid, and will vent to atmosphere through vent tube 20 or the auxiliary vent. In the case of superconducting magnets, for example as used in Magnetic Resonance Imaging (MRI) systems, liquid helium is typically used as the cryogen. Liquid helium is expensive, and difficult to obtain in some parts of the world. It is also a finite resource. For these reasons, it is desired to reduce the consumption of helium cryogen during transport or at other times that the refrigerator 17 is not operating.

It is of course possible to transport the cryostat and the equipment 10 at ambient temperature, empty of cryogen. This will avoid the problem of cryogen consumption during transport. However, the equipment 10 and indeed the cryostat itself will need to be cooled on arrival at its destination. Such cooling is a skilled process, and on-site cooling has been found to be very expensive. Furthermore, the quantity of cryogen required to cool the equipment and cryostat from ambient temperature on arrival at an installation site has been found to far exceed current consumption rates over a reasonable transport time. Typical current systems are able to travel for at least 30 days without the refrigerator operating, and without the liquid cryogen boiling dry.

Current known solutions consume approximately 2.5-3.0% of cryogen inventory per day of transit time. On current systems, this may equate to a consumption of 50 liters of liquid helium per day. The present invention aims to reduce this level of consumption, and so increase the maximum transport time, simplifying the logistics of delivering a cooled equipment to a destination and/or reducing the consumption of cryogen.

Known attempts to address this problem have met with difficulties. Some of the known attempts to address this problem will be briefly discussed.

A second thermal radiation shield, concentric with first thermal shield 16 may be provided. This has been found somewhat effective in reducing thermal influx to the cryogen vessel, but has required increased size of OVC, and caused increased manufacturing costs.

A thermally conductive pipe has been run around the thermal shield, carrying escaping cryogen gas. As the gas is at a temperature little above its boiling point, which is about 4K, such arrangements serve to cool the thermal shield. This has been somewhat effective at reducing thermal influx to the cryogen vessel. Such an arrangement is described, for example, in U.S. Pat. No. 7,170,377 and UK patent application GB 2 414 536, but has also required increased size of OVC to accommodate the thickness of the conductive pipe. Increased manufacturing costs also resulted from the additional assembly effort, and the material and labor costs of increasing the size of the OVC.

SUMMARY OF THE INVENTION

An object of the present invention is to provide an improved cryostat that reduces consumption of cryogen during transportation, or at any time when active refrigeration is not present, and that does not suffer from the problems of the prior art.

The above object is achieved in accordance with the present invention in a cryostat, and a method for constructing a thermal radiation shield in a cryostat, wherein a cryogen vessel has a vent path that allows cryogen gas to escape from the cryogen vessel, and wherein the cryostat has a thermal radiation shield interposed between the cryogen vessel and the outer vacuum container in which the cryogen vessel is contained. The vent path is configured to cause escaping cryogen gas to be directed through a conduit, which forms an integral part of the thermal radiation shield. The conduit is formed as a joining conduit that has a bore and at least two flanges, and the thermal radiation shield is formed of at least two sections, with the first and second sections thereof being respectively attached to the respective flanges of the joining conduit.

DESCRIPTION OF THE PREFERRED EMBODIMENTS

The present invention improves upon the cooled thermal radiation shield, as proposed in U.S. Pat. No. 7,170,377 and UK patent application GB 2 414 536. These prior art documents propose a cryogen-gas-carrying, thermally conductive tube wrapped around the outside of a thermal radiation shield. The thickness of the thermal radiation shield is effectively increased by the thickness of the tube, plus any fittings used to attach the tube to the thermal radiation shield. The increased effective thickness of the shield leads to increased overall dimension of the cryostat, including a larger OVC. In turn, this means a more costly system. Assembly is also complicated by the need to mount the cryogen-gas-carrying tube. The present invention aims to provide similar functionality but without increasing the thickness of the thermal radiation shield to such an extent; and to provide a simplified method of assembling a thermal radiation shield, by providing a thermally conductive conduit for carrying boiled off cryogen gas from the cryostat, as an integral part of the thermal shield.

Figure 1:
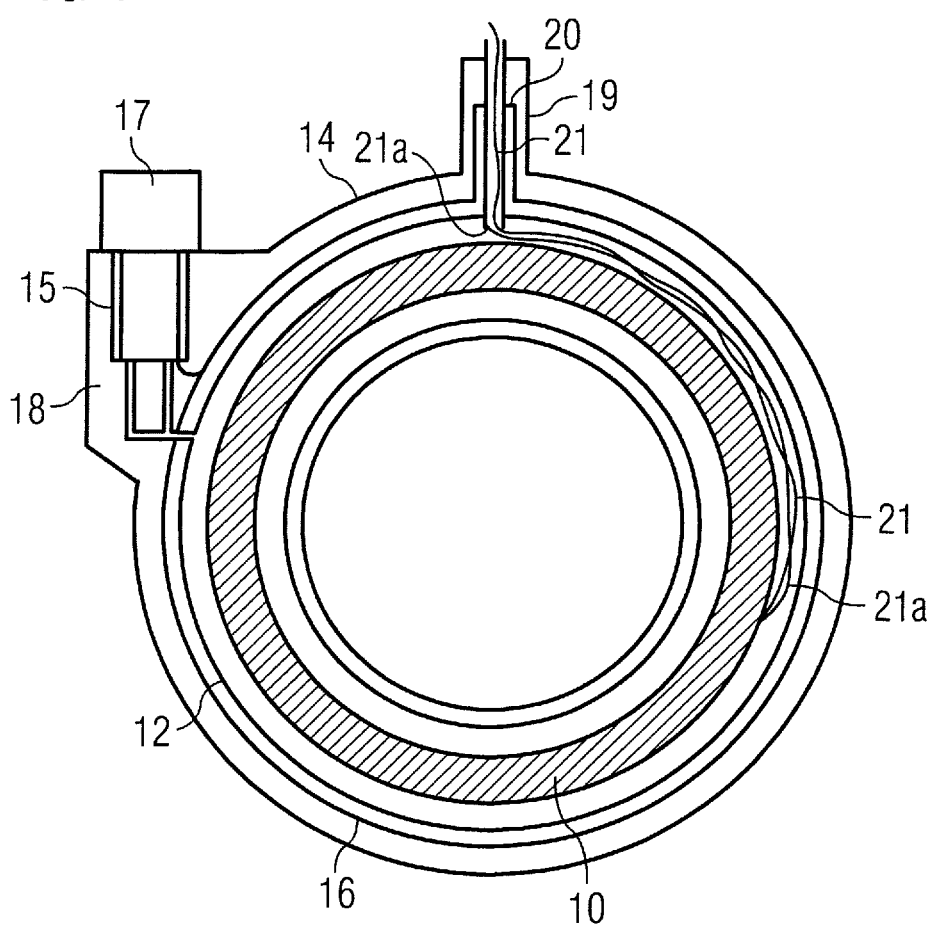
FIG. 1 shows a conventional arrangement of a cryostat containing a superconducting magnet.
Figure 2:
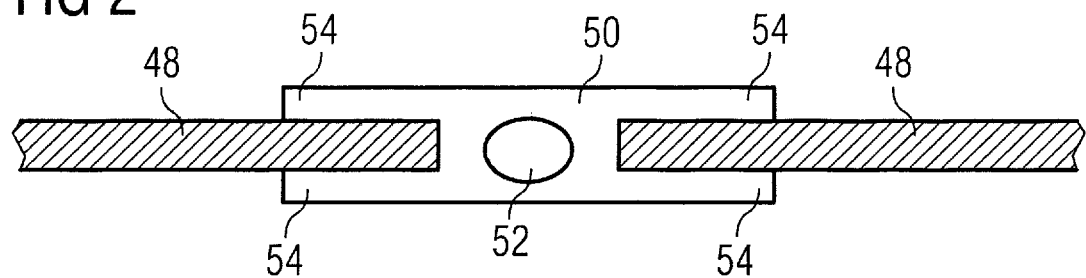
FIG. 2 shows a cross-section of a portion of a thermal radiation shield of the present invention, comprising a joining conduit.
Figure 4:
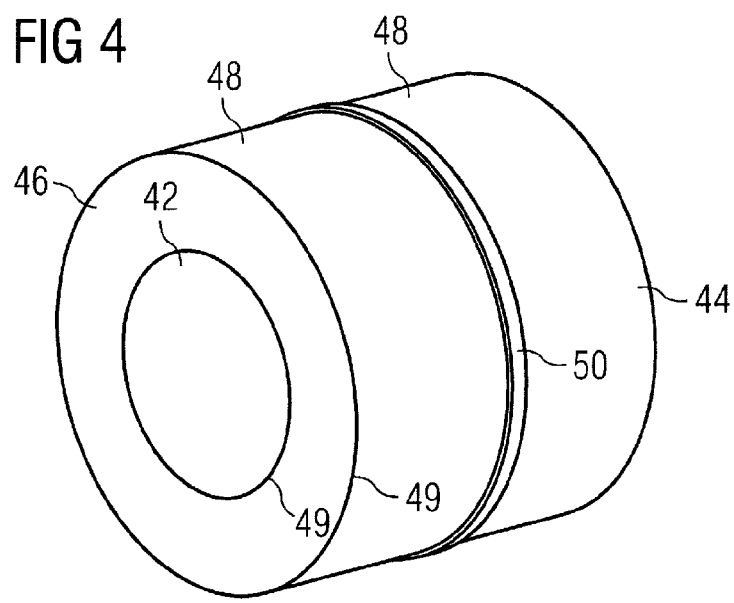
FIG. 4 shows a perspective view of a thermal radiation shield according to an embodiment of the present invention.

FIG. 4 shows a perspective view of a thermal radiation shield according to the present invention, and FIG. 2 shows an enlarged cross-section of a part of the radiation shield of FIG. 4. As shown in FIG. 4, the thermal radiation shield 40 is typically a closed, dual-cylinder having an inner cylindrical surface 42, an outer cylindrical surface 44 and substantially planar end walls 46 joining inner and outer cylindrical surfaces. It is typically constructed of aluminum. Joints 49 between end walls 46 and respective cylindrical surfaces 42, 44 are made by any convenient method, typically by welding. In the illustrated embodiment, the outer cylindrical surface 44 is axially divided into two or more sections 48. The sections 48 are joined together using a joining conduit 50 which extends around the thermal radiation shield 44 in a manner which will now be described with reference to FIG. 2.

FIG. 2 shows a cross-section of a joining conduit 50 according to an aspect of the present invention. The conduit 50 includes a substantially central bore 52 for carrying cryogen gas and pairs of retaining flanges 54 on opposing sides for retaining sections 48 of thermal radiation shield. Joining conduit 50 is preferably provided as a linear extrusion, flexible enough to be bent to the radius of the sections 48 of the thermal radiation shield. Edges of respective sections 48 of the thermal radiation shield are placed into slots defined by respective pairs of retaining flanges 54. The edges may be retained by an interference fit, or at least one of each pair of retaining flanges may be mechanically deformed onto the corresponding section 48 of the thermal radiation shield. Other acceptable arrangements for attaching the retaining flanges onto the corresponding section 48 of the thermal radiation shield include welding, soldering, brazing, clips, clamps, through-hole tabs, push-to-fit retaining features, such as complementary cavities and protrusions provided in the material of the thermal radiation shield and the material of the conduit, the provision of barbs or gripping textures in the material of the shield and/or the material of the conduit. At least one of the flanges may have a chamfer to assist with assembly of the thermal radiation shield. It is believed that the joint between the retaining flanges and the thermal radiation shield needs structural and thermal integrity.

Any combination of interference fit, mechanical deformation or any other arrangement may alternatively be used as desired. It is necessary to ensure that sufficient thermal contact is made between the joining conduit and the sections 48 of thermal radiation shield that the gas escaping through the bore(s) cools the shield effectively.

During assembly of the cryostat, the thermal radiation shield may be constructed, with the sections 48 of thermal radiation shield 44 being assembled together using the joining conduit 50, followed by mounting of the end walls 46, typically by welding. The conduit 50 does not form a closed loop, but ends of the conduit are arranged (not shown) to direct escaping cryogen gas from the vent tube 20 and/or the auxiliary vent into one end of the bore 52, around the thermal radiation shield, and out of the other end of the bore to atmosphere.

During transport of the cryostat, or at other times that no active refrigeration is provided, thermal influx and/or heat generation within the cryostat cause some of the liquid cryogen to boil off. The resulting cryogen gas, at a temperature near to its boiling point, escapes from the cryogen vessel through vent tube 20 or an auxiliary vent. According to the present invention, at least some of this escaping cryogen gas is routed through the bore 52 of joining conduit 50. As the escaping cryogen gas circulates through the bore, it draws heat from the conduit, which in turn cools the thermal radiation shield. Since the thermal radiation shield is then at a lower temperature than would have been the case had the gas simply been allowed to vent to atmosphere, the temperature differential between the shield and the cryogen vessel is reduced, which in turn reduces the heat influx to the cryogen vessel. It is known that radiated power scales as $T^4$, where T is the temperature differential between source and destination of the thermal radiation. Any reduction in the temperature differential will therefore lead to a significant reduction in energy transferred by thermal radiation. Such reduction in heat influx leads to a corresponding reduction in cryogen consumption, or an increased autonomy for transport, or both.

Figure 3:
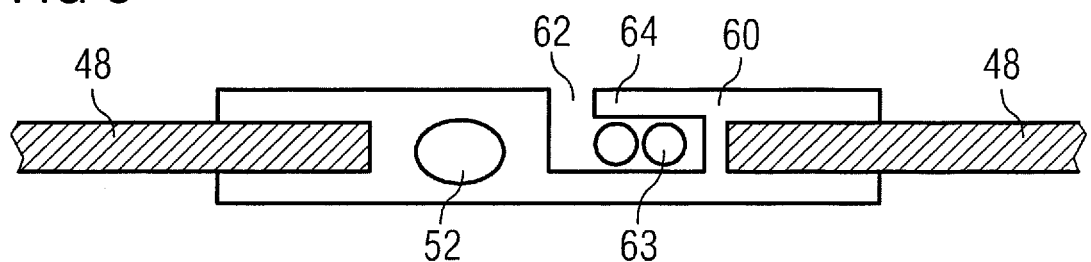
FIGS. 3-3B show cross-sections of a portion of thermal radiation shields according to further embodiments of the present invention, each comprising a joining conduit.
Figure 3A:
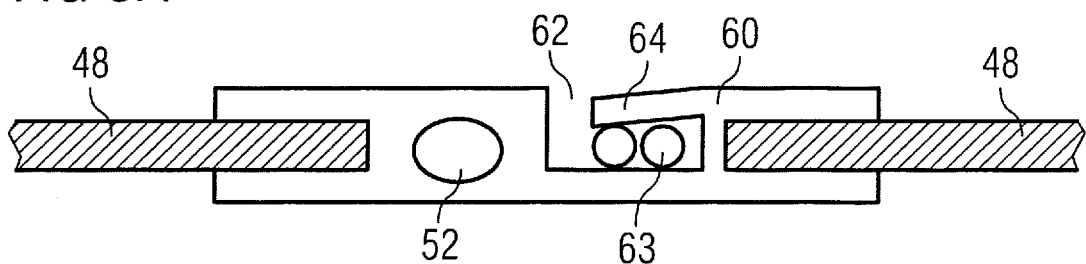

FIG. 3 illustrates an improvement to the embodiment shown in FIG. 2. In FIG. 3, the joining conduit 60 includes a channel 62 which is preferably partially closed, or is able to be partially closed, for example by deformation of a wall. According to this embodiment, auxiliary equipment 63 such as electrical wires and cables, temperature sensors, or pipes may be housed within the channel 62. As shown in FIG. 3, the channel 62 may be embodied as a U-shaped channel with an overhang 64, which overhang may be deformed onto retained auxiliary equipment to secure it into place within the channel, as illustrated in FIG. 3A. In one particular embodiment, a perforated pipe may be provided and used to improve evacuation of the volume between the cryogen vessel and the OVC, known as pumpdown.

Figure 3B:
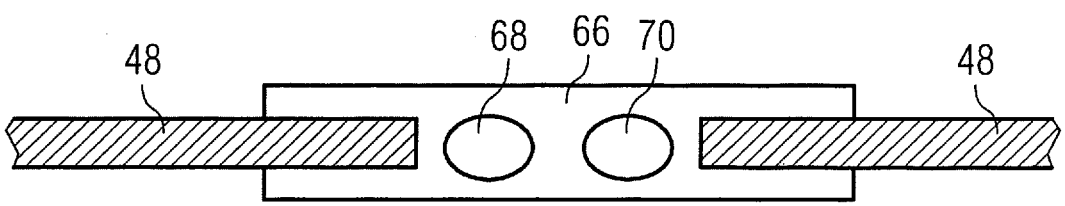

FIG. 3B shows a further embodiment of the present invention. In this embodiment, joining conduit 66 is provided with two bores 68, 70. Such an arrangement may provide improved cooling of the thermal radiation shield by causing cryogen gas escaping from the cryogen vessel to pass twice through the joining conduit. This may be arranged by providing one end of the joining conduit 66 with a U-shaped return connector, which joins corresponding ends of the two bores 68, 70 together, with ingress and egress fittings at opposite ends of bores 68, 70. The gas flow in the two conduits will be in opposing directions. Alternatively, the gas flows in the two conduits may be directed in a same direction by connecting a first end of one bore to a second end of the other bore, with ingress and egress fittings connected to remaining bore endings. It is believed that gas flowing from the cryogen vessel may provide useful cooling to the thermal radiation shield through more than one circuit of the thermal radiation shield. As such, further embodiments, similar to that of FIG. 3B, may be provided with three or more bores, suitably connected, to provide an extended path for escaping cryogen gas. Embodiments such as shown in FIG. 3B may be provided with one or more channels, such as shown in FIG. 3A for retaining auxiliary equipment.

Figure 5:
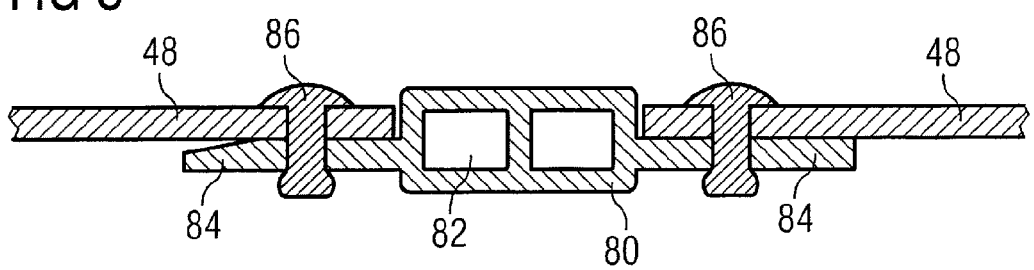
FIG. 5 shows a cross-section of a portion of a thermal radiation shield of the present invention, comprising a joining conduit.
Figure 6:
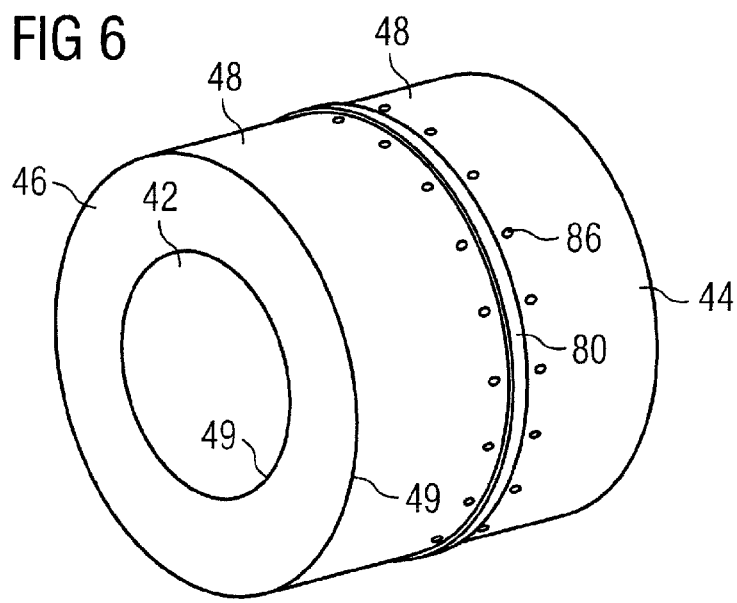
FIG. 6 shows a perspective view of a thermal radiation shield according to an embodiment of the present invention.

FIG. 5 shows another embodiment of a joining conduit 80 according to the present invention, and FIG. 6 shows a perspective view of a thermal radiation shield constructed using the joining conduit of FIG. 5.

As illustrated in FIG. 5, joining conduit 80 provides at least one bore 82 with flanges 84 on opposing sides. Since no slots are provided for retaining the edges of the sections 48 of thermal radiation shield, the joining conduit must be attached by means such as rivets 86, welding, soldering, brazing, clips, clamps, through-hole tabs and so on. It is necessary to ensure that sufficient thermal contact is made between the joining conduit 80 and the sections 48 of thermal radiation shield that the cryogen gas escaping through the bore(s) 82 cools the shield effectively.

FIG. 6 illustrates a perspective view of a thermal radiation shield according to the present invention, using a joining conduit 80 as illustrated in FIG. 5. The thermal radiation shield is similar to that illustrated in FIG. 4, other than having cylindrical wall sections 48 attached to the joining conduit 80 by rivets 86. Joints 49 between end walls 46 and respective cylindrical surfaces 42, 44 are made by any convenient method, typically by welding.

Figure 7A:
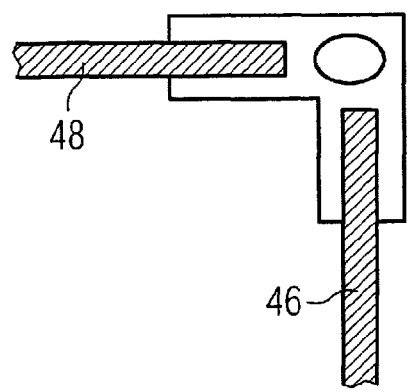
FIGS. 7A-7B show cross-sections of a portion of thermal radiation shields according to further embodiments of the present invention, each comprising a joining conduit.
Figure 7B:
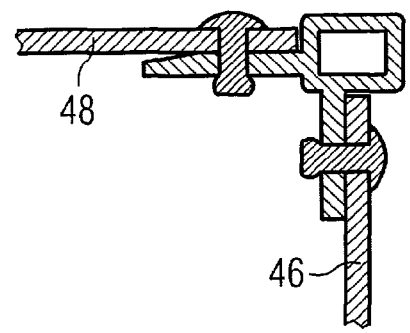

In alternate embodiments, joining conduits may be used to join the end walls 46 to the respective cylindrical surfaces 42, 44. FIGS. 7A and 7B illustrate joining conduits suitable for this purpose, based on the embodiments of FIGS. 2, 5 respectively. Variations on these conduits may be provided, containing multiple bores, as in FIG. 3B or containing a channel for retaining auxiliary equipment, as in FIG. 3A. In further embodiments, the end walls 46 of the thermal radiation shield may be made up of several sections, with joining conduits according to the present invention being provided to join the sections together.

According to the present invention, escaping cryogen gas is directed through a conduit which forms an integral part of a thermal radiation shield.

Figure 8:
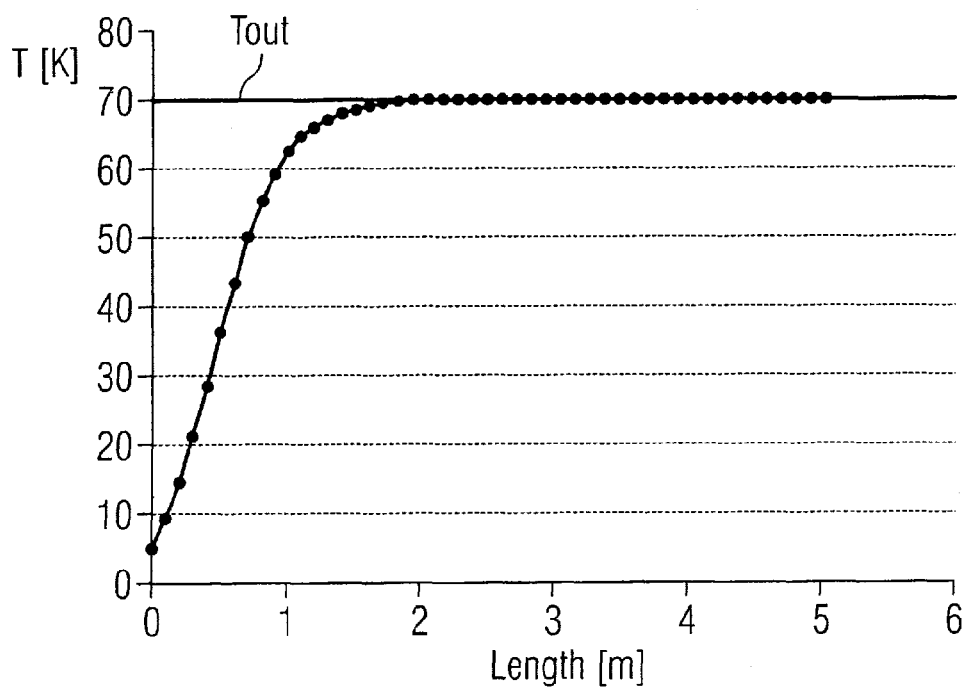
FIG. 8 shows summarized results of simulations of the effect of a thermal radiation shield according to the present invention.

The inventor has performed certain simulations on an embodiment of the invention, to demonstrate its effectiveness. Various lengths of single 8.8 mm diameter bore extruded aluminum conduit were simulated, carrying escaping cryogen gas to cool the thermal radiation shield of a typical cryostat. FIG. 8 shows summarized results. The temperature Tout represents the temperature of cryogen gas venting to atmosphere from the downstream end of the joining conduit. As shown, with a conduit length of more than 2 m, the thermal shield temperature equals the temperature Tout of the escaping cryogen gas. No further cooling effect is found by extending the length of the joining conduit beyond 2 m. This length will be referred to herein as the 100% heat transfer length. Different results would have been obtained with different cryostats, different boil-off rates and different sizes or different numbers of bores in the conduit. Table 1 below shows calculated results of the 100% heat transfer length for different shield temperatures—and so also temperatures of gas venting to atmosphere, and for different gas flow rates (expressed in equivalent liters of liquid helium per day). The results show that, for the cryostat considered in the simulation, a length of 2 m is sufficient to provide all available shield cooling. As the inner cylindrical surface 42 of a thermal radiation shield used in a cryostat housing a superconducting MRI magnet typically has a diameter of slightly less than 1 m, a single bore conduit around the circumference of the inner cylindrical surface may prove sufficient to cool the thermal radiation shield. The outer cylindrical surface 44 of such a thermal radiation shield typically has a diameter of about 1.8 m, so a single bore conduit around the circumference of the outer cylindrical surface may well prove sufficient to cool the thermal radiation shield.

TABLE 1

| Shield Temperature (K) | Flow rate (liters/day) | Length of joining conduit needed for 100% heat transfer (m) |
|---|---|---|
| 100 | 50 | 2 |
| 100 | 25 | 1.3 |
| 70 | 50 | 1.9 |
| 70 | 25 | 1.4 |

In a preferred embodiment of the present invention, the thermal radiation shield is constructed as follows. The outer cylindrical surface 44 is axially divided into two sections 48. Similarly, the inner cylindrical surface is axially divided into two sections. Each substantially planar end wall 46 is joined at joints 49 to one section 48 of the outer cylindrical surface and one section of the inner cylindrical surface, typically by welding, although other means such as brazing, soldering or adhesive bonding could be used provided that the resulting joint is sufficiently thermally conductive. This will produce two half-shields. These half-shields may then be mounted onto the cryogen vessel, by means known in themselves to those skilled in the art, the two half-shields being joined at outer cylindrical surface 44 and inner cylindrical surface by a joining conduit as described. Arrangements must be made to direct at least some of cryogen gas escaping from the cryogen vessel through a bore in at least one of the joining conduits. It may be found sufficient to direct escaping gas through only one of the joining conduits. It may be simplest to direct the escaping gas through only the conduit provided as an integral part of the outer cylindrical surface 44, since provision will in any case be made for a vent tube to pass through this surface. The joining conduit provided as an integral part of the inner cylindrical surface 42 may have an unused bore, or the bore may be absent. The joining conduit provided as an integral part of the inner cylindrical surface may be joined into a closed loop by welding, soldering or any suitable method.

Any of the conduits described may be used in this assembly process. Conduits such as shown in FIG. 2 may retain edges of the sections of inner and outer cylindrical surfaces by any suitable arrangement. Examples include interference fit, by having flanges deformed into mechanical engagement with the edges, by use of push-to-fit retaining features, such as complementary cavities and protrusions provided in the material of the thermal radiation shield and the material of the conduit, soldering, welding, the provision of barbs or gripping textures in the material of the shield and/or the material of the conduit.

Conduits such as shown in FIG. 5 may be mechanically connected to the edges of the sections of inner and outer cylindrical surfaces by any suitable arrangement. Examples include flanges deformed into mechanical engagement with the edges, by use of push-to-fit retaining features, such as complementary cavities and protrusions provided in the material of the shield and the material of the conduit, soldering, welding, riveting or the provision of barbs or gripping textures in the material of the shield and/or the material of the conduit. As illustrated in FIG. 5, one of the flanges may have a chamfer 88 to assist with assembly of the thermal radiation shield.

Typically, the joining conduit provided by the present invention will have a constant cross-section, and may conveniently be provided by extrusion of aluminum. A thermally-conductive surface passivation, such as hard anodizing, may be applied to the aluminum extrusion. The joining conduit may be extruded from any other suitable, thermally conductive material, such as copper. Embodiments may employ more than one type of joining conduit, for example a double-bore conduit as part of the outer cylindrical surface, with a cable-carrying joining conduit as shown in FIG. 3A as a part of the inner cylindrical surface.

While the present invention has been described with specific reference to a limited number of particular embodiments, many modifications and variations will be apparent to those skilled in the art, and fall within the scope of the present invention. For example, thermal radiation shields according to the present invention may be provided in cryostats holding cooled equipment other than magnets for MRI systems, being useful in any cryogenic storage Dewar. Similarly, thermal radiation shields according to the present invention are useful for cryostats containing any liquid cryogen, and the present invention is not limited to helium-cooled cryostats.

Although modifications and changes may be suggested by those skilled in the art, it is the intention of the inventors to embody within the patent warranted hereon all changes and modifications as reasonably and properly come within the scope of their contribution to the art.

We claim as our invention:

1. A cryostat comprising:
   an outer vacuum container;
   a cryogen vessel contained within said outer vacuum container, said cryogen vessel operating with a cryogen gas and having a vent path that allows a portion of said cryogen gas to exit from said cryogen vessel;
   a substantially cylindrical, closed thermal radiation shield between said cryogen vessel and said outer vacuum container, said thermal radiation shield surrounding said cryogen vessel and thermally shielding said cryogen vessel from thermal radiation emanating from said outer vacuum container;
   said thermal radiation shield being comprised of a plurality of shield parts joined together to form a closed, hollow cylinder having an internal surface that faces said cryogen vessel; and
   said thermal radiation shield comprising a joining conduit interposed between and joining two of said shield parts, said joining conduit comprising a conduit body that proceeds along a circumference of said closed cylinder and that forms a part of said interior surface of said closed cylinder, said conduit body comprising two flanges that respectively engage said two of said shield parts to join said two of said shield parts together, and said conduit body having a bore therein that also extends along said circumference and that is in communication with said vent path to direct at least some of said portion of said cryogen gas in said vent path through said bore to augment the thermal shielding of the cryogen vessel by said thermal radiation shield.

2. A cryostat according to claim 1 wherein said two of said shield parts are attached to the respective flanges of said conduit by attachment means selected from the group consisting of welding, soldering, brazing, clips, clamps, through-hole tabs, push-to-fit retaining features, complementary cavities and protrusions provided in the material of the thermal radiation shield and the material of the conduit, barbs or gripping textures in the material of the shield and/or the material of the conduit, riveting.

3. A cryostat according to claim 1 wherein one of the flanges is provided with a chamfer.

4. A cryostat according to claim 1 wherein the at least two flanges are positioned on opposite sides of the bore.

5. A cryostat according to claim 1 wherein the joining conduit comprises two pairs of flanges, each pair of flanges defining a slot such that respective first and second sections of said two of said shield parts are retained within respective slots.

6. A cryostat according to claim 5 wherein the respective sections are retained within respective slots by a retainer selected from the group consisting of welding, soldering, brazing, clips, clamps, through-hole tabs, interference fit, flanges deformed into mechanical engagement, push-to-fit retaining features, complementary cavities and protrusions provided in the material of the sections and the material of the conduit, barbs, and gripping textures in the material of the sections and/or the material of the conduit.

7. A cryostat according to claim 5 wherein the pairs of flanges are positioned on opposite sides of the bore.

8. A cryostat according to claim 1 wherein the conduit body comprises at least two bores and the vent path causes escaping cryogen gas to be directed through at least two of said bores.

9. A cryostat according to claim 1, wherein the conduit comprises a channel for retaining auxiliary equipment.

10. A cryostat according to claim 1, wherein the channel is partially closed by an overhang.

11. A cryostat according to claim 7, wherein the overhang is deformable, allowing auxiliary equipment to be retained within the channel.

12. A cryostat as claimed in claim 1 wherein said two of said shield parts are each formed as a hollow cylindrical shield part, and wherein said joining conduit is substantially planar.

13. A cryostat as claimed in claim 1 wherein said two of said shield parts comprise a hollow, cylindrical shield part and a substantially circular shield part forming an end wall of said closed cylinder, and wherein said joining conduit forms a substantially right angle.

14. A joining conduit for a cryostat, said cryostat comprising an outer vacuum container, a cryogen vessel contained within said outer vacuum container, said cryogen vessel operating with a cryogen gas and having a vent path that allows a portion of said cryogen gas to exit from said cryogen vessel, a substantially cylindrical, closed thermal radiation shield between said cryogen vessel and said outer vacuum container, said thermal radiation shield surrounding said cryogen vessel and thermally shielding said cryogen vessel from thermal radiation emanating from said outer vacuum container, said thermal radiation shield being comprised of a plurality of shield parts joined together to form a closed, hollow cylinder having an internal surface that faces said cryogen vessel, said joining conduit comprising:
- a conduit body configured to be interposed between and join two of said shield parts, said conduit body being configured to proceed along a circumference of said closed cylinder and to form a part of said interior surface of said closed cylinder;
- said conduit body comprising two flanges that are respectively configured to engage said two of said shield parts to join said two of said shield parts together; and
- said conduit body having a bore therein that extends along said circumference and that is in communication with said vent path to direct at least some of said portion of said cryogen gas in said vent path through said bore to augment the thermal shielding of the cryogen vessel by said thermal radiation shield.

15. A joining conduit according to claim 14, comprising respective pairs of retaining flanges, each flange being directed in respective directions generally away from the central bore in said cross-section, said pairs defining respective slots between the members of each pair, said slots being directed in respective directions generally away from the central bore, such that said two of said shield parts may be retained within said slots.

16. A joining conduit according to claim 14, wherein at least one of the flanges has a chamfer to assist with assembly of a thermal radiation shield.

17. A joining conduit according to any of claim 14 wherein the joining conduit includes at least one channel for housing auxiliary equipment.

18. A joining conduit according to claim 17 wherein the channel is partially closed.

19. A joining conduit according to claim 18 wherein the channel is U-shaped in cross-section and is provided with an overhang, which overhang is deformable onto any retained auxiliary equipment, thereby to secure such auxiliary equipment into place within the channel.

20. A joining conduit according to claim 14, comprising at least two bores, enabling said cryogen gas from said vent path to pass at least twice through the joining conduit.

21. A joining conduit as claimed in claim 14 wherein each of said two of said shield parts is a hollow cylinder, and wherein said conduit body is planar.

22. A joining conduit as claimed in claim 14 wherein said two of said shield parts comprise a hollow cylinder shield part and a substantially circular shield part that forms one end of said closed cylinder, and wherein said conduit body forms a right angle.

23. A method for assembling a thermal radiation shield for a cryostat, said cryostat comprising an outer vacuum container and a cryogen vessel contained within said outer vacuum container, said cryogen vessel operating with a cryogen gas and having a vent path that allows a portion of said cryogen gas to exit from said cryogen vessel, said method comprising:
- providing a plurality of thermal radiation shield parts;
- assembling said plurality of thermal radiation shield parts to form a substantially cylindrical, closed thermal radiation shield configured to be located between said cryogen vessel and said outer vacuum container and configured to surround said cryogen vessel and thermally shield said cryogen vessel from thermal radiation emanating from said outer vacuum container, said thermal radiation shield having an interior surface configured to face said cryogen vessel;
- joining two of said plurality of shield parts together with a joining conduit located between said two of said plurality of shield parts and, with said joining conduit, forming a portion of said interior surface;
- providing said joining conduit with two flanges that respectively engage said two of said shield parts to join said two of said shield parts together;
- providing a bore in said joining conduit and placing said bore in communication with said vent path and thereby directing at least some of said portion of said cryogen gas in said vent path through said bore to augment the thermal shielding of the cryogen vessel by said thermal radiation shield.

* * * * *